US011164969B2

(12) United States Patent
Edwards

(10) Patent No.: US 11,164,969 B2
(45) Date of Patent: Nov. 2, 2021

(54) SEGMENTED POWER TRANSISTOR

(71) Applicant: Texas Instruments Incorporated, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 66 days.

(21) Appl. No.: 15/363,072

(22) Filed: Nov. 29, 2016

(65) Prior Publication Data

US 2017/0077294 A1 Mar. 16, 2017

Related U.S. Application Data

(63) Continuation of application No. 14/531,797, filed on Nov. 3, 2014, now Pat. No. 9,543,430.

(51) Int. Cl.
*H01L 29/40* (2006.01)
*H01L 29/78* (2006.01)
(Continued)

(52) U.S. Cl.
CPC ...... *H01L 29/7816* (2013.01); *H01L 23/4824* (2013.01); *H01L 23/528* (2013.01);
(Continued)

(58) Field of Classification Search
CPC ............ H01L 29/7816; H01L 29/0869; H01L 23/5226; H01L 23/5228; H01L 23/528;
(Continued)

(56) References Cited

U.S. PATENT DOCUMENTS 6,587,320 B1 7/2003 Russ et al.
8,247,872 B2 8/2012 Son
(Continued)

FOREIGN PATENT DOCUMENTS

CN 101752349 A 6/2010
CN 102842576 A 12/2012
JP 2013098274 A 5/2013

OTHER PUBLICATIONS

CNIPA Search Report for Application No. 201510737242.3 dated Feb. 3, 2020.
Machine translation of JP2013098274A.

*Primary Examiner* — Samuel Park
(74) *Attorney, Agent, or Firm* — Andrew R. Ralston; Charles A. Brill; Frank D. Cimino

(57) ABSTRACT

A power transistor includes multiple substantially parallel transistor fingers, where each finger includes a conductive source stripe and a conductive drain stripe. The power transistor also includes multiple substantially parallel conductive connection lines, where each conductive connection line connects at least one source stripe to a common source connection or at least one drain stripe to a common drain connection. The conductive connection lines are disposed substantially perpendicular to the transistor fingers. At least one of the source or drain stripes is segmented into multiple portions, where adjacent portions are separated by a cut location having a higher electrical resistance than remaining portions of the at least one segmented source or drain stripe.

22 Claims, 20 Drawing Sheets

(51) Int. Cl.
*H01L 27/088* (2006.01)
*H01L 29/06* (2006.01)
*H01L 29/417* (2006.01)
*H01L 23/482* (2006.01)
*H01L 29/08* (2006.01)
*H01L 23/522* (2006.01)
*H01L 23/528* (2006.01)
*H01L 23/532* (2006.01)

(52) U.S. Cl.
CPC ...... *H01L 23/5226* (2013.01); *H01L 23/5228* (2013.01); *H01L 23/53209* (2013.01); *H01L 27/088* (2013.01); *H01L 29/0642* (2013.01); *H01L 29/0696* (2013.01); *H01L 29/0869* (2013.01); *H01L 29/41758* (2013.01); *H01L 23/5286* (2013.01); *H01L 2924/0002* (2013.01)

(58) Field of Classification Search
CPC ........... H01L 23/53209; H01L 23/4824; H01L 27/088; H01L 29/0696; H01L 29/41758; H01L 29/0642; H01L 2924/0002; H01L 23/5286; H01L 29/0847; H01L 29/78; H01L 27/0207; H01L 29/0692; H01L 29/4238; H01L 27/0266; H01L 27/11521

See application file for complete search history.

(56) References Cited

U.S. PATENT DOCUMENTS

| 8,692,330 B2 | 4/2014 | Otsuru et al. | |
| 2006/0081985 A1* | 4/2006 | Beach | H01L 29/0692 257/745 |
| 2008/0128830 A1* | 6/2008 | Kobayashi | H01L 24/05 257/401 |
| 2011/0248317 A1* | 10/2011 | Kim | H01L 27/11548 257/208 |
| 2012/0086497 A1* | 4/2012 | Vorhaus | H01L 27/0207 327/427 |

* cited by examiner

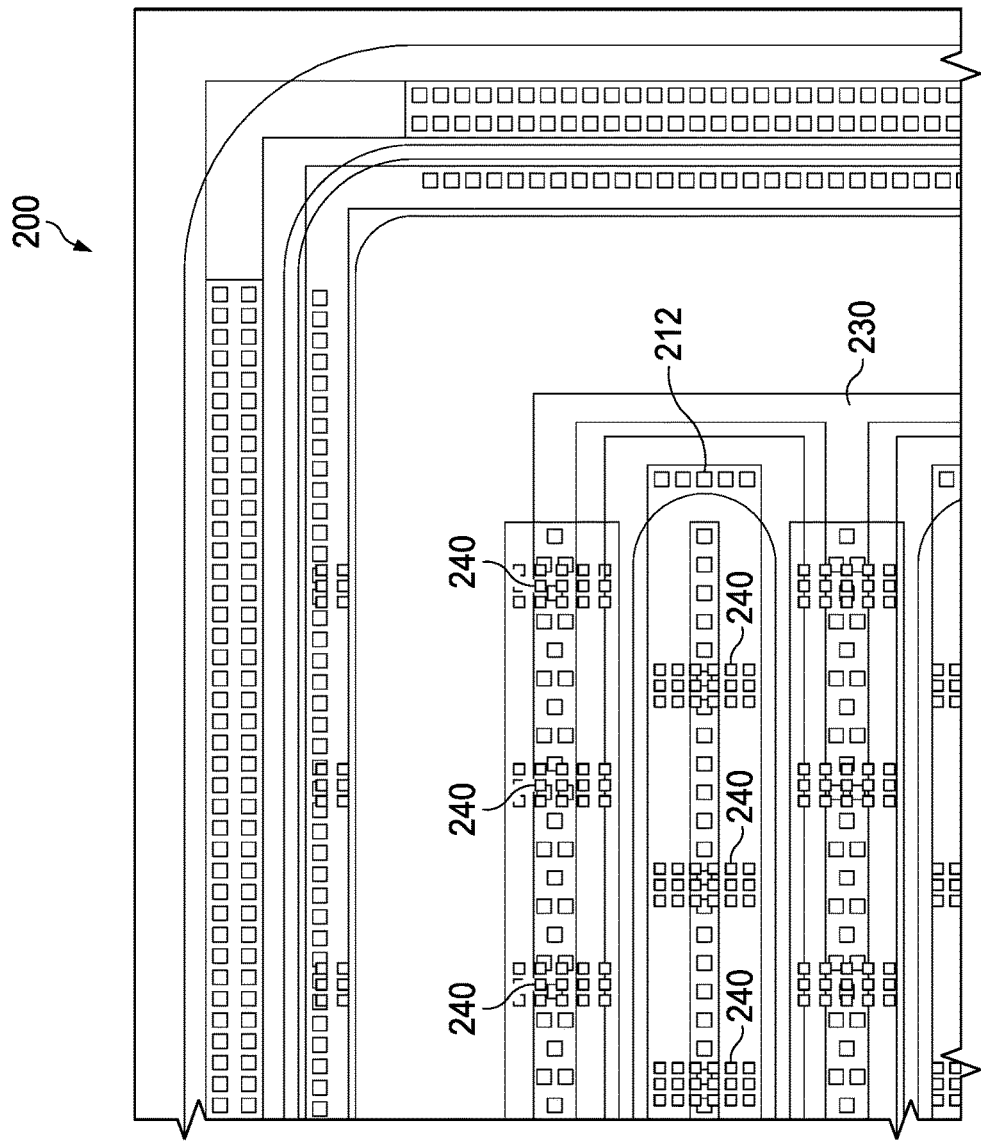

SEGMENTED POWER TRANSISTOR

CROSS-REFERENCE TO RELATED APPLICATIONS

Under 35 U.S.C. § 120, this continuation application claims benefits of and priority to U.S. patent application Ser. No. 14/531,797 (TI-74833), filed on Nov. 3, 2014, the entirety of which are hereby incorporated herein by reference.

TECHNICAL FIELD

This disclosure is generally directed to power transistors. More specifically, this disclosure is directed to a segmented power transistor.

BACKGROUND

A power transistor is typically a type of metal oxide semiconductor (MOS) transistor designed to handle significant power levels. Power transistors are found in many common electronic devices, including power supplies, voltage converters, integrated circuits, and low-voltage motor controllers. A large power transistor may be made up of many "fingers," each of which can be long and may be considered to include multiple sub-transistors.

SUMMARY

This disclosure provides a segmented power transistor.

In a first example, a power transistor includes multiple substantially parallel transistor fingers, where each finger includes a conductive source stripe and a conductive drain stripe. The power transistor also includes multiple substantially parallel conductive connection lines, where each conductive connection line connects at least one source stripe to a common source connection or at least one drain stripe to a common drain connection. The conductive connection lines are disposed substantially perpendicular to the transistor fingers. At least one of the source or drain stripes is segmented into multiple portions, where adjacent portions are separated by a cut location having a higher electrical resistance than remaining portions of the at least one segmented source or drain stripe.

In a second example, an electronic device includes multiple power transistors. Each of the power transistors includes multiple substantially parallel transistor fingers, where each finger includes a conductive source stripe and a conductive drain stripe. Each power transistor also includes multiple substantially parallel conductive connection lines, where each conductive connection line connects at least one source stripe to a common source connection or at least one drain stripe to a common drain connection. The conductive connection lines are disposed substantially perpendicular to the transistor fingers. At least one of the source or drain stripes is segmented into multiple portions, where adjacent portions are separated by a cut location having a higher electrical resistance than remaining portions of the at least one segmented source or drain stripe.

In a third example, a power transistor includes multiple substantially parallel transistor fingers, each finger including a conductive source stripe and a conductive drain stripe. The power transistor also includes an isolation tank region electrically connected to each of the conductive drain stripes. The power transistor further includes multiple substantially parallel conductive connection lines, each connection line connecting at least one source stripe to a common source connection or the isolation tank region to a common drain connection, the conductive connection lines disposed substantially perpendicular to the transistor fingers. The isolation tank region is segmented into multiple portions, and wherein adjacent portions are separated by a cut location having a higher electrical resistance than remaining portions of the isolation tank region.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which:

FIGS. 2A through 2D illustrate a graphical layout design of an example power transistor according to this disclosure;

DETAILED DESCRIPTION

FIGS. 1 through 7D, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1A:
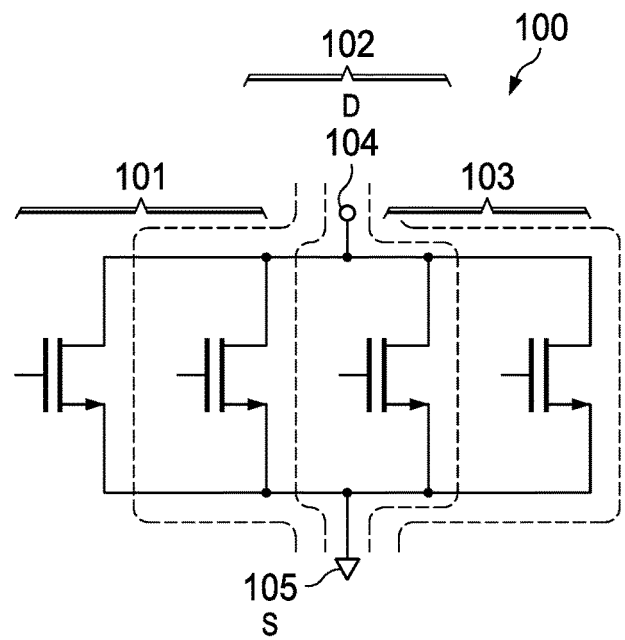
FIGS. 1A and 1B illustrate a schematic circuit diagram depicting filamentation in a portion of a power transistor.
Figure 1B:
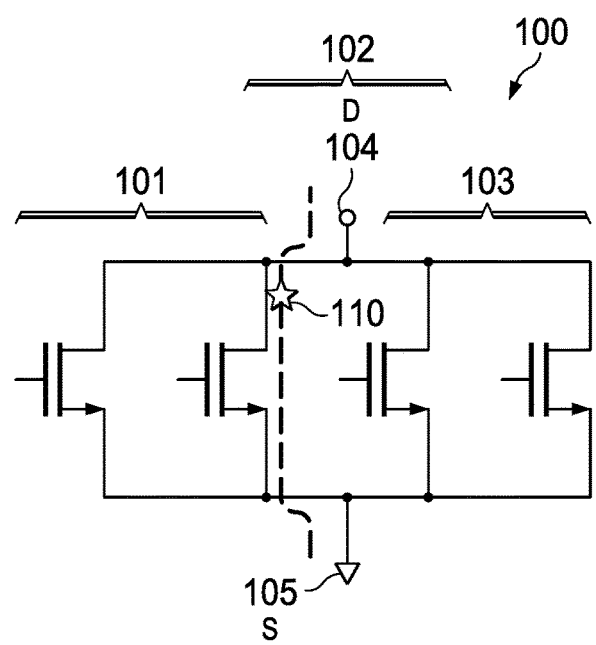

FIGS. 1A and 1B illustrate a schematic circuit diagram depicting filamentation in a portion of a power transistor 100. As shown in FIG. 1A, the power transistor 100 includes multiple sub-transistors 101-103 that share a common drain 104 and a common source 105. In various applications, it may be necessary or desirable to distribute current substantially evenly among these sub-transistors 101-103. In FIG. 1A, current from the drain 104 to the source 105 is ideally distributed through all of the sub-transistor paths as indicated by the dashed lines.

In many power transistor applications, conductive strapping material allows high current densities to flow along the transistor fingers. Because of this, during switching transients or at the onset of breakdown, high-voltage power transistors often fail at a localized portion of a finger (sometimes referred to as a "hot spot"). This is due to the occurrence of filamentation in which current flow is concentrated along one path in the power transistor, instead of being distributed more evenly across multiple paths in the power transistor.

FIG. 1B illustrates one example of filamentation. As shown in FIG. 1B, current in the power transistor 100 becomes concentrated across a single path represented by the dashed line. A hot spot 110 in the power transistor 100 could represent the first point that undergoes avalanche breakdown as the drain voltage is increased towards the breakdown voltage of the power transistor 100.

Figure 2A:
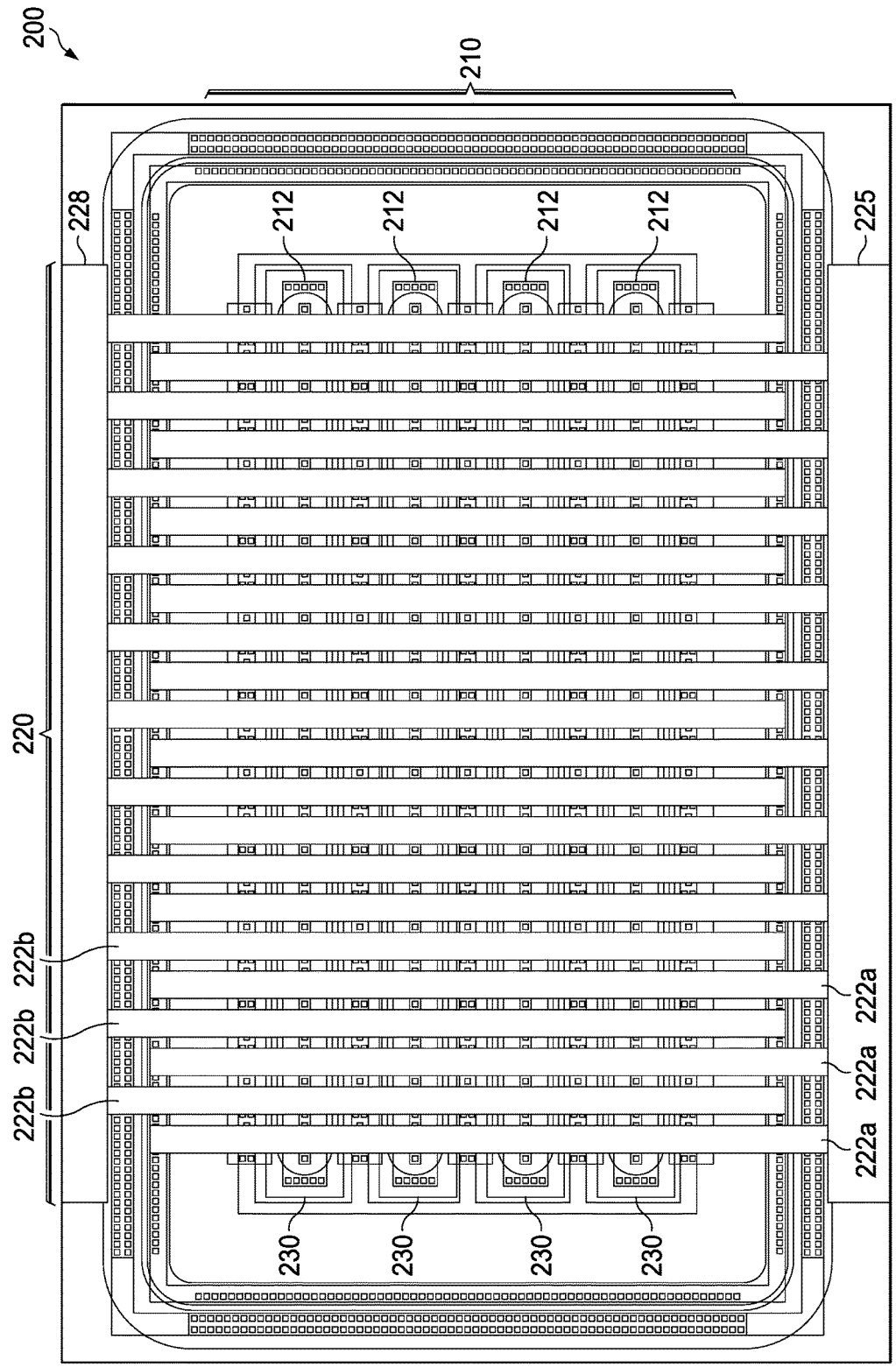
Figure 2B:
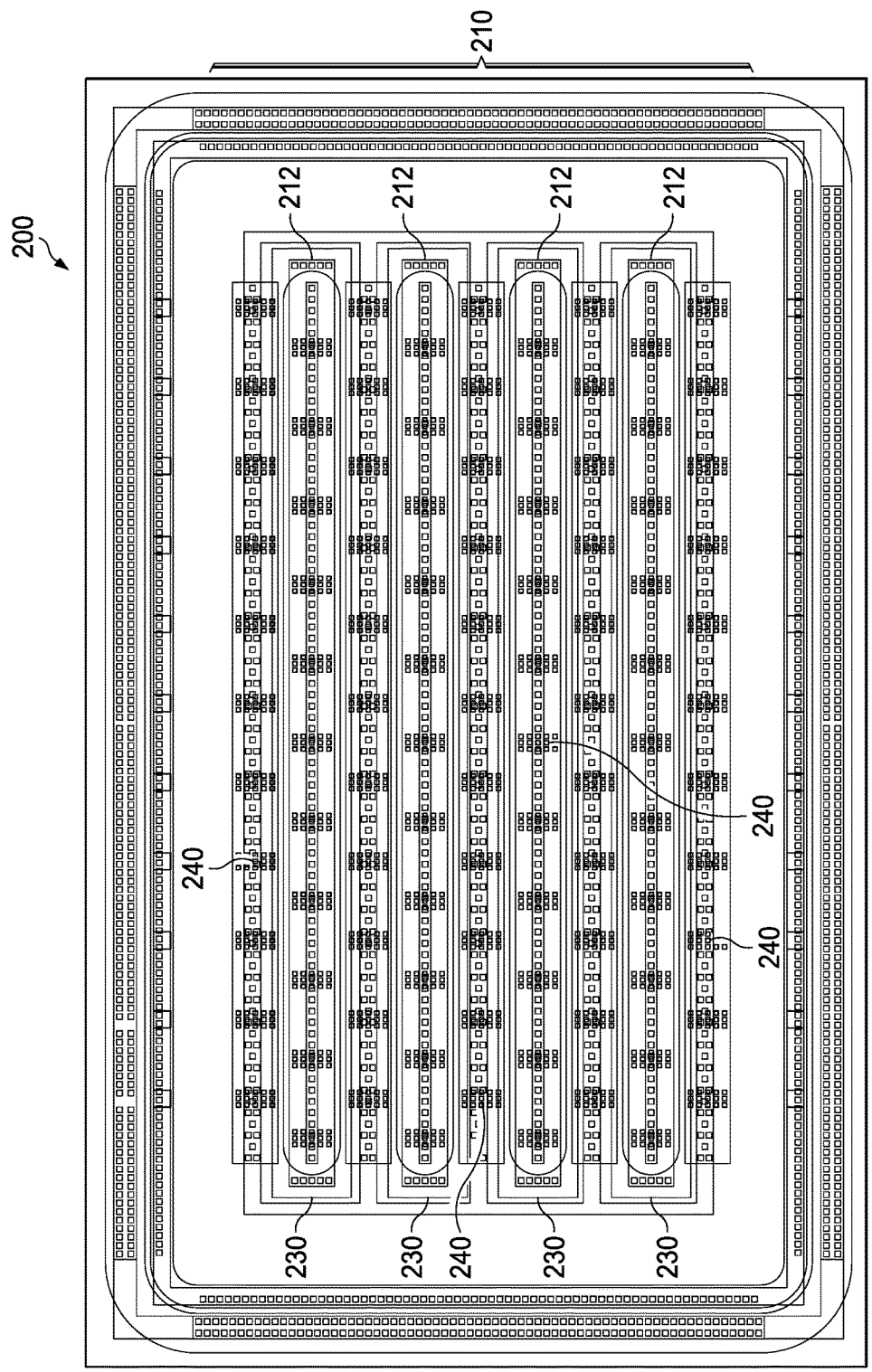
Figure 2D:
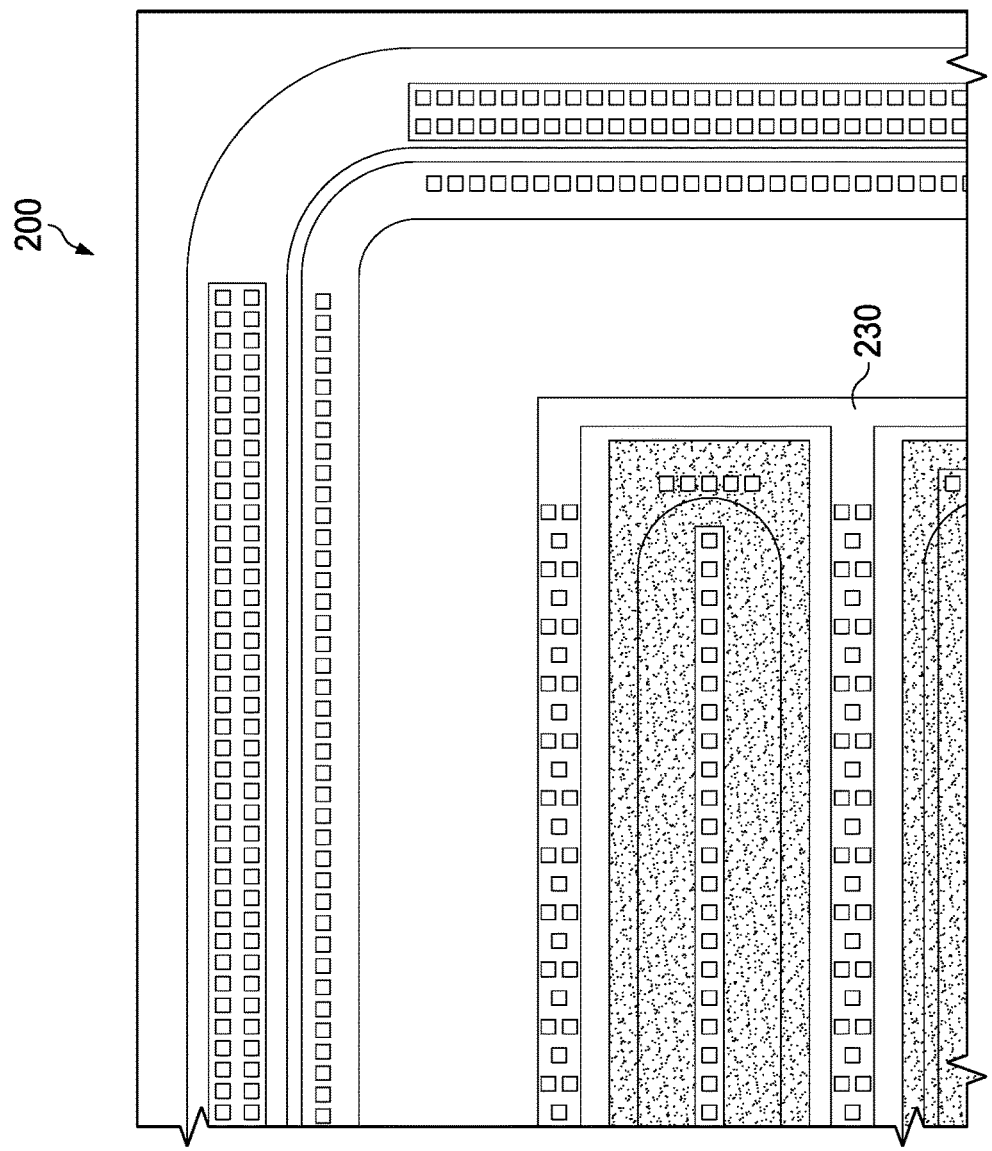

FIGS. 2A through 2D illustrate a graphical layout design of an example power transistor 200 according to this disclosure. In this example, the power transistor 200 is a laterally diffused metal oxide semiconductor (LDMOS) power transistor similar to the power transistor 100 of FIG. 1. The power transistor 200 is suitable for use in a wide variety of electronic devices. The power transistor 200 includes a conductive layer 220 (MET2) oriented generally vertically in FIG. 2A, which is disposed over a conductive layer 210 (MET1) oriented generally horizontally in FIG. 2A. The conductive layers 210-220 could be formed from any suitable material(s), such as one or more metals. The conductive layer 210 is disposed over a silicide layer 230, which is formed over a substrate (such as a doped silicon layer). FIG. 2B illustrates the power transistor 200 with the conductive layer 220 removed to more clearly show the conductive layer 210. FIG. 2C illustrates a zoomed-in view of a portion of FIG. 2B. FIG. 2D illustrates the zoomed-in view of FIG. 2C with the conductive layer 210 removed to more clearly show a portion of the silicide layer 230.

The conductive layer 210 includes multiple fingers (or "stripes") 212 (illustrated horizontally in FIGS. 2A-2C), and each finger 212 includes a drain and a source. While four fingers are depicted in the figures, it will be understood that this is merely one example, and other embodiments may include more or fewer fingers. In the example power transistor 200, the fingers 212 are "source centered," where each finger 212 includes a source stripe and a racetrack-shaped gate around the source stripe. The drain is split, with half of the drain on one side of the source stripe and half of the drain on the other side of the source stripe. One half of a drain can be shared between two adjacent fingers 212.

As shown in FIG. 2A, the conductive layer 220 includes multiple connection lines 222a-222b that alternately connect to a common source connection 225 or a common drain connection 228 of the power transistor 200. That is, the connection lines 222a connect to the common source connection 225, and the connection lines 222b connect to the common drain connection 228. In a typical power transistor, the connection lines 222a-222b are oriented parallel to the fingers 212. However, in the power transistor 200, the connection lines 222a-222b are oriented perpendicular to the fingers 212. While such an orientation may not be quite as efficient, this layout facilitates the use of segmentation embodiments discussed below.

In FIGS. 2B and 2C, the conductive layer 220 is hidden to better show the fingers 212. Multiple conductive vias 240 (such as vias filled with tungsten) connect the source stripe or drain stripe of each finger 212 in the conductive layer 210 to a corresponding connection line 222a-222b in the conductive layer 220. More particularly, some of the vias 240 connect source stripes of the fingers 212 to the source connection lines 222a, and other vias 240 connect drain stripes of the fingers 212 to the drain connection lines 222b. Each via 240 is configured to carry current between one of the fingers 212 and one of the connection lines 222a-222b in the conductive layer 220.

As shown in FIGS. 2A-2C, each finger 212 is uninterrupted and low resistance, so current could potentially filament across any one of the fingers 212. For example, if current flow suddenly spiked somewhere mid-way along the length of one of the fingers 212 (such as due to a breakdown event), the uniformity of the finger 212 and its associated low resistance along its full length can increase the likelihood of filamentation. Filamentation limits the total current that the power transistor 200 can conduct, hence limiting its safe operating area (SOA). Filamentation also limits the ability to scale the current handling capability of a power transistor by increasing its width. Moreover, occurrences of filamentation can subject a power transistor to possible early failure.

To overcome issues caused by filamentation, embodiments of the power transistors disclosed here are segmented at various terminals. Segmentation reduces or prevents hot spot formation by allowing high current density to flow only perpendicular to the fingers (and out of a device array). This is achieved by using resistive regions that divide the fingers into segments, which discourages lateral current flow along the device fingers. The segmentation may be performed on the source, drain, or tank connections of the power transistor or to a combination of two or more of these connections as described in greater detail below.

In the power transistor 200, segmentation can be performed by cutting one or more portions of the conductive layer 210, removing any contact under the cut region(s), and optionally placing a silicide block in the cut region(s) to remove the silicide and increase resistance between device segments as described in greater detail below. The small resistance of a metal or other conductive connection to each segment causes a voltage drop to develop if that segment breaks down first and tries to conduct all of the device current. Segmentation does not fully disconnect neighboring segments but rather introduces a resistance between the neighboring segments that discourages the concentration of the device's full current into a single portion of the device.

The disclosed embodiments are applicable to a wide variety of power transistors. This includes drain extended n-type MOS (NMOS), drain extended p-type MOS (PMOS), n-type LDMOS, and p-type LDMOS power transistors. This also includes SCRMOS power transistors, which are power transistors (such as LDMOS or drain-extended complimentary metal oxide semiconductor (DECMOS) power transistors) converted into silicon controlled rectifiers (SCRs) by adding emitters to their drains (such as a PSD in the case of an n-type LDMOS power transistor). However, it will be understood that the disclosed embodiments may be applicable for any other suitable type of power transistor or electronic component.

Figure 3A:
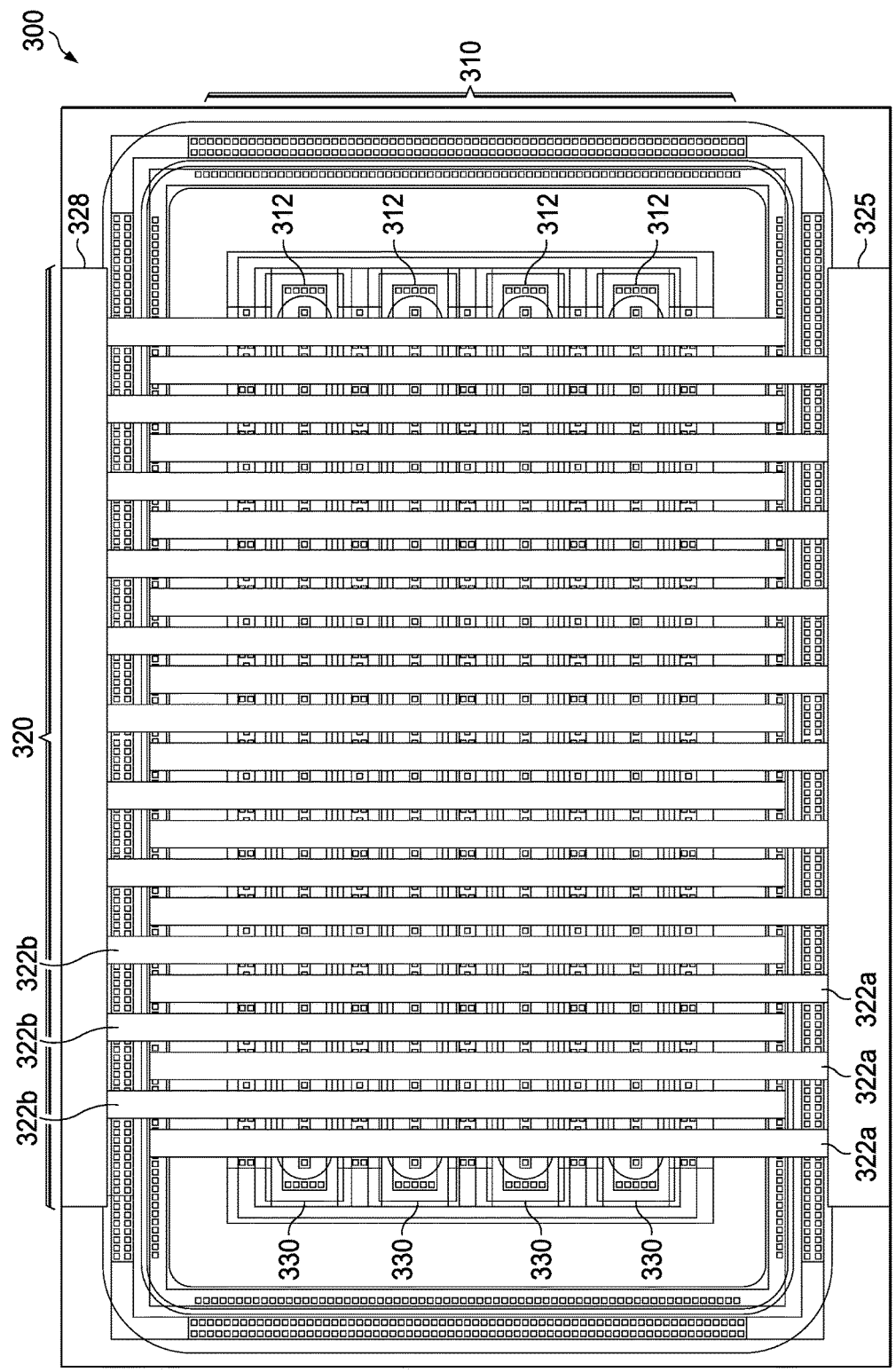
FIGS. 3A through 3F illustrate a graphical layout design of an example power transistor that includes source segmentation according to this disclosure.
Figure 3B:
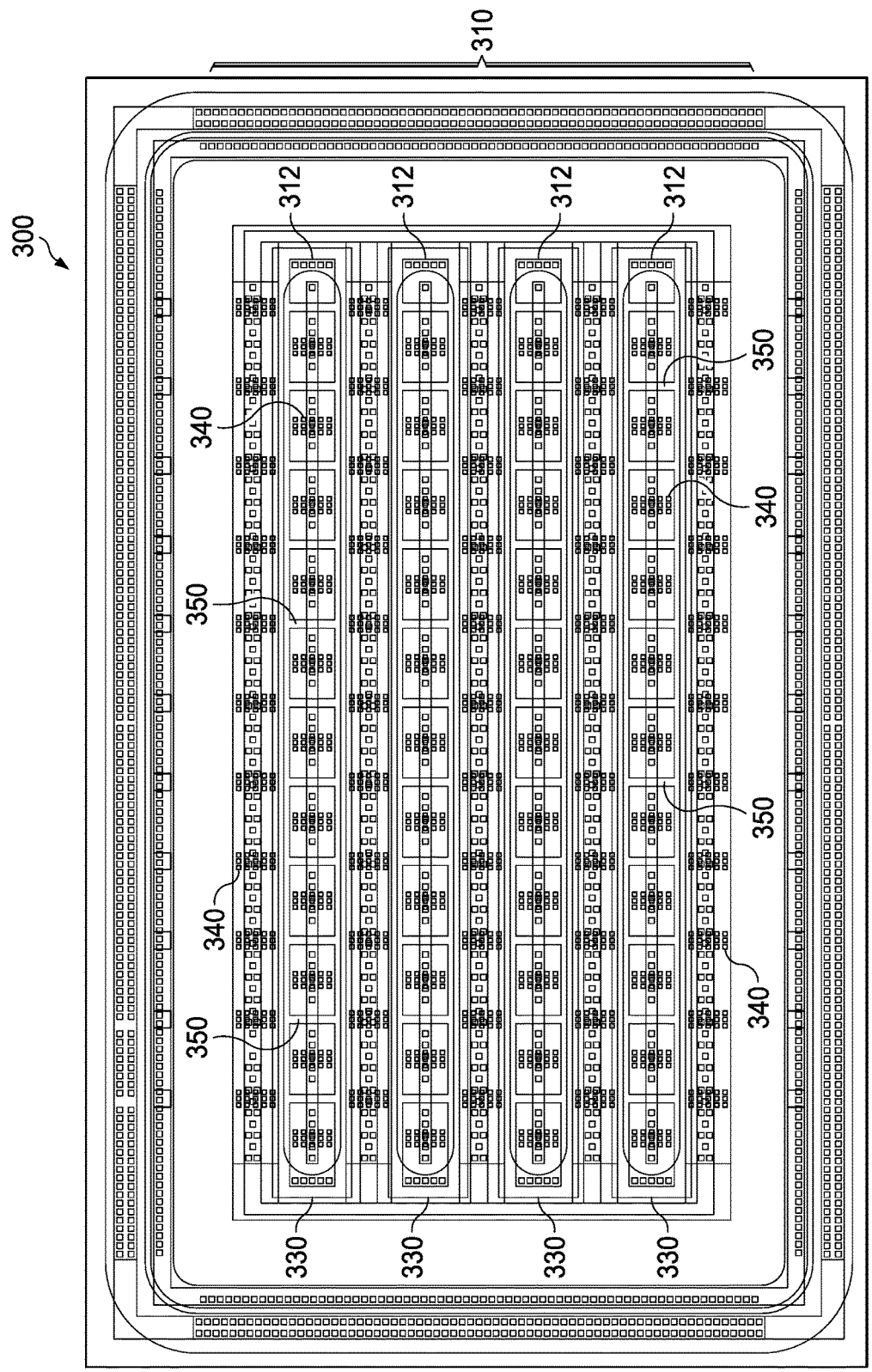
Figure 3C:
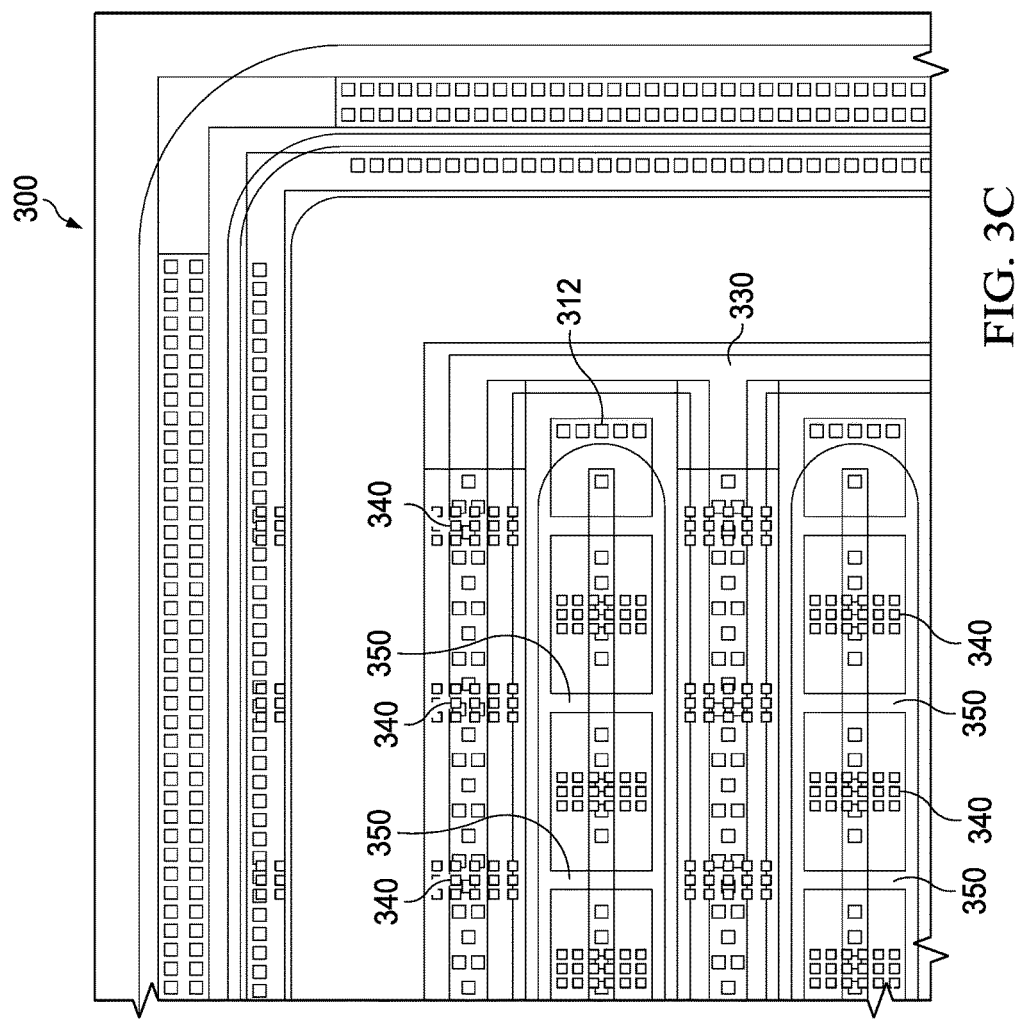
Figure 3D:
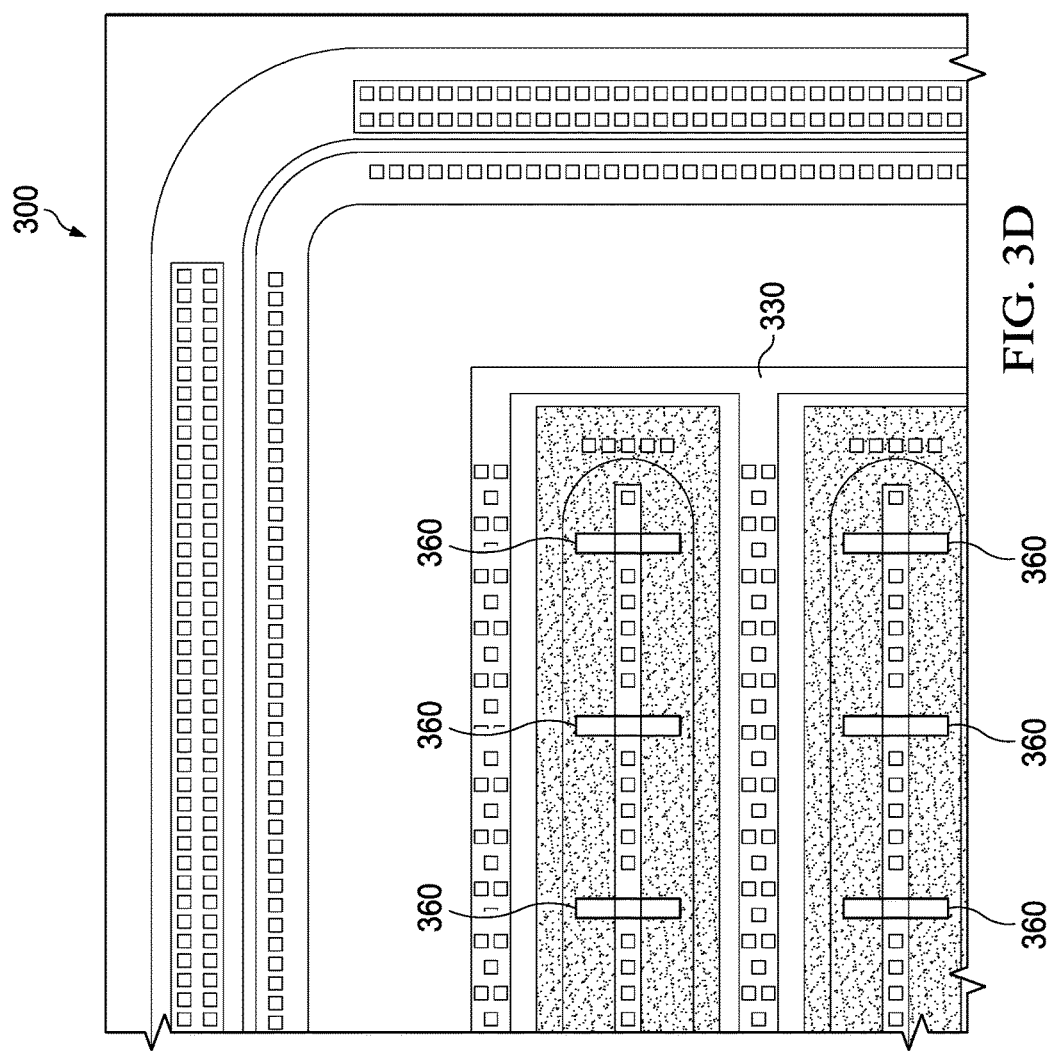
Figure 3E:
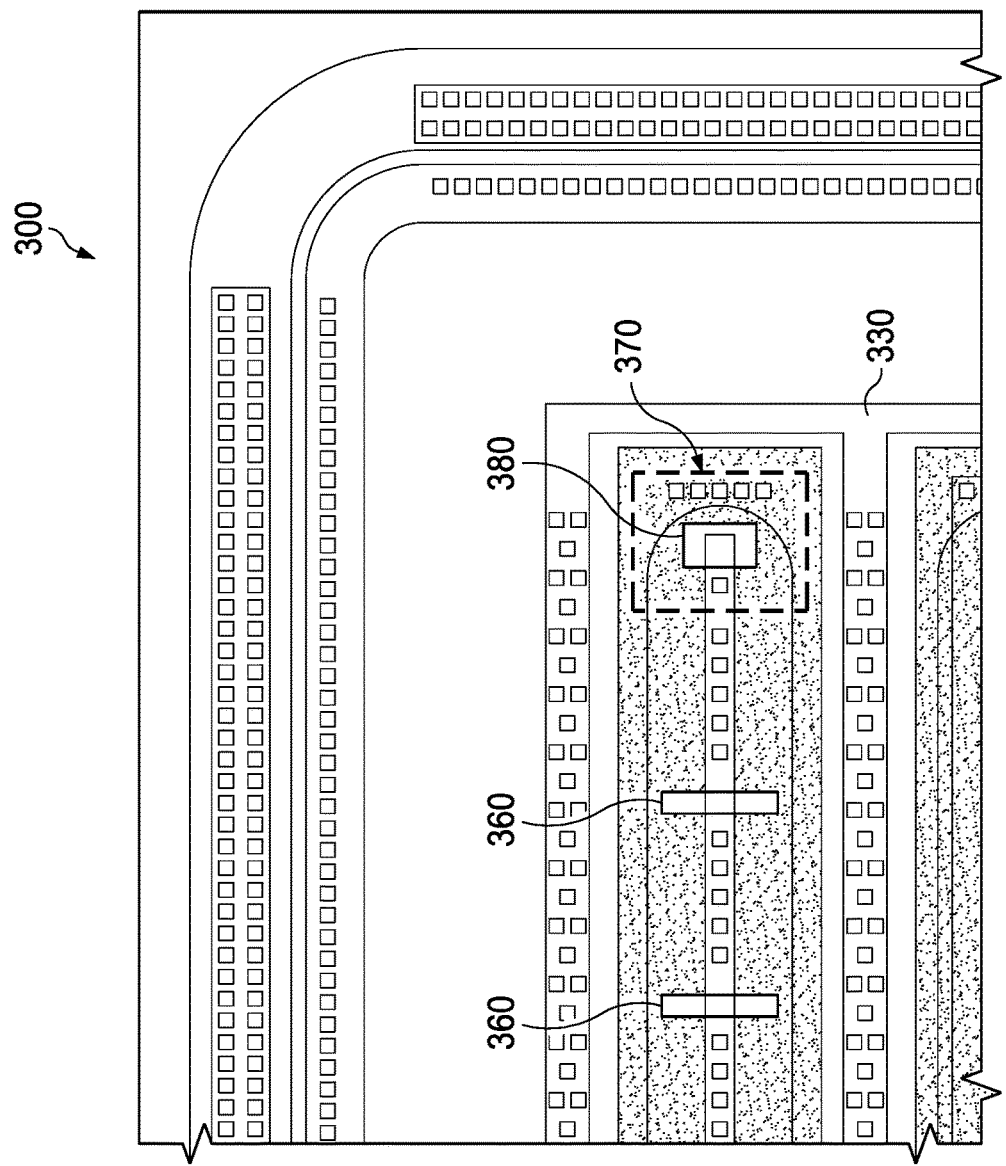
Figure 3F:
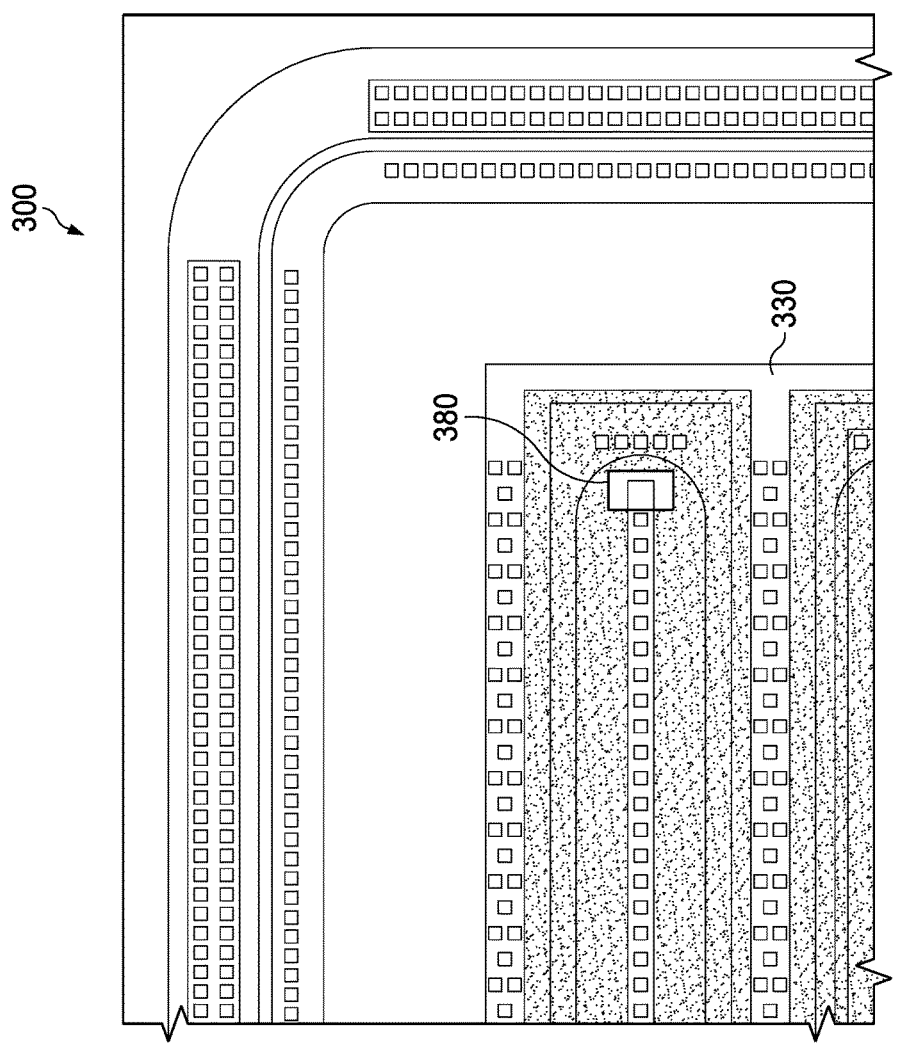

FIGS. 3A through 3F illustrate a graphical layout design of an example power transistor 300 that includes source segmentation according to this disclosure. Many of the components of the power transistor 300 are the same as or similar to the components of the power transistor 200 in FIGS. 2A-2D. For example, the power transistor 300 includes a conductive layer 310, a conductive layer 320, a silicide layer 330, multiple fingers 312, multiple connection lines 322a-322b, a common source connection 325, a common drain connection 328, and multiple vias 340. To the extent that these components are the same as or similar to corresponding components of FIGS. 2A-2D, a detailed description will be omitted. Similar to FIGS. 2B-2D, FIG. 3B illustrates the power transistor 300 with the conductive layer 320 removed, FIG. 3C illustrates a zoomed-in view of a portion of FIG. 3B, and FIG. 3D illustrates the zoomed-in view of FIG. 3C with the conductive layer 310 removed. FIGS. 3E and 3F will be described below.

As shown in FIGS. 3B and 3C, the source region of each finger 312 is segmented at a plurality of cut locations 350 along the length of the finger 312. The cut at each cut location 350 could be achieved, for example, by cutting the conductive layer 310 of the source region of the finger 312 and removing any affected contact underneath. In some embodiments, a silicide block (SIBLK) 360 is also placed in the cut region to remove the silicide layer 330 under the cut location 350 as shown in FIG. 3D. The SIBLK 360 blocks the formation of silicide, which is a metal and has much lower resistance than the silicon moat itself. The cut at each cut location 350 does not fully disconnect neighboring segments but instead introduces a resistance between the neighboring segments by requiring current to pass through the silicide layer 330 and a silicon moat layer (or pass through the silicon moat layer if the SIBLK 360 is in place). The resistance discourages the concentration of the full current of the power transistor 300 into a single portion of the power transistor 300, thus reducing the likelihood of filamentation.

As an example, if a given source segment of a finger 312 breaks down before the other source segments break down, the broken-down segment may try to pull the full device current into the segment. However, the resistance of the cuts in the adjacent cut locations 350 results in a voltage that acts as a "negative feedback," discouraging the concentration of the full device current into the broken-down source segment. Similarly, the conductive source connection line 322a connecting the broken-down source segment to the common source connection 325 also develops a voltage drop. This voltage drop reduces the gate-to-source voltage $V_{GS}$ for the broken-down segment and reduces the gate-controlled current, thus allowing other segments to begin to conduct. This results in an overall reduction in the likelihood of filamentation.

FIGS. 3E and 3F illustrate embodiments in which the power transistor 300 includes source endcap segmentation. In FIG. 3E, it can be seen that the source region of each finger 312 has a "racetrack" layout with a rounded endcap 370 on each end of the finger 312. In order to discourage current concentration on the endcap 370, a SIBLK 380 can be formed over the endcap 370 along with the SIBLK regions 360. In other embodiments, the SIBLK 380 can be formed on the source endcap without the SIBLK regions 360 as shown in FIG. 3F.

Figure 4:
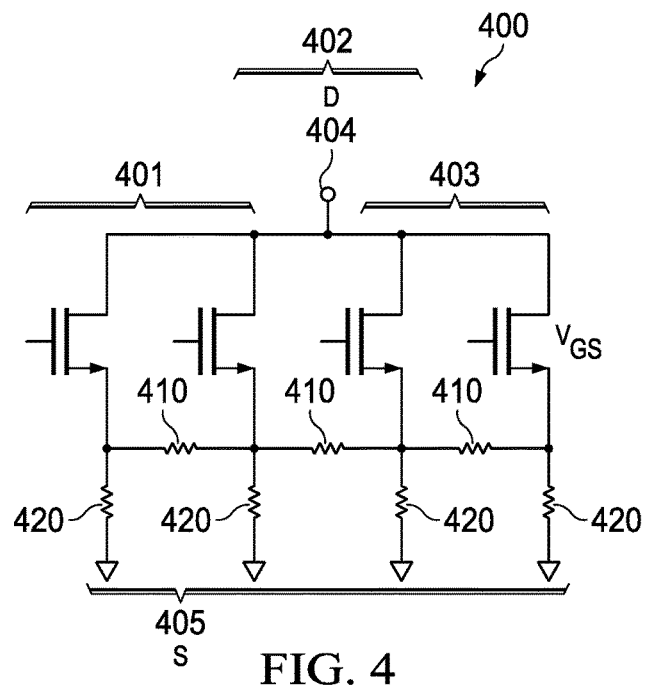
FIG. 4 illustrates a schematic circuit diagram of a portion of a power transistor that includes source segmentation according to this disclosure.

FIG. 4 illustrates a schematic circuit diagram of a portion of a power transistor 400 that includes source segmentation according to this disclosure. As shown in FIG. 4, the power transistor 400 includes a plurality of sub-transistors 401-403 that share a common drain 404 and a common source 405. The power transistor 400 also includes a first set of resistors 410 and a second set of resistors 420. The first set of resistors 410 represent resistances between neighboring segments of the source region of each finger. For example, the resistors 410 can represent the resistance of the moat layer as a result of the segmentation cuts at the cut locations 350 and the SIBLK 360 in the power transistor 300 shown in FIGS. 3A-3D. The second set of resistors 420 represent resistances of the conductive source connection lines 322a. If a source segment attempts to push current into the common source connection 325 (represented as common source 405 in FIG. 4), the current would go through one of the long thin conductive connection lines 322a, which are represented as resistors 420. These resistors 420 may not have a very large resistance, but it is enough to generate a voltage that reduces the $V_{GS}$ voltage. That in turn acts as a negative feedback, reducing current and discouraging filamentation.

Figure 5A:
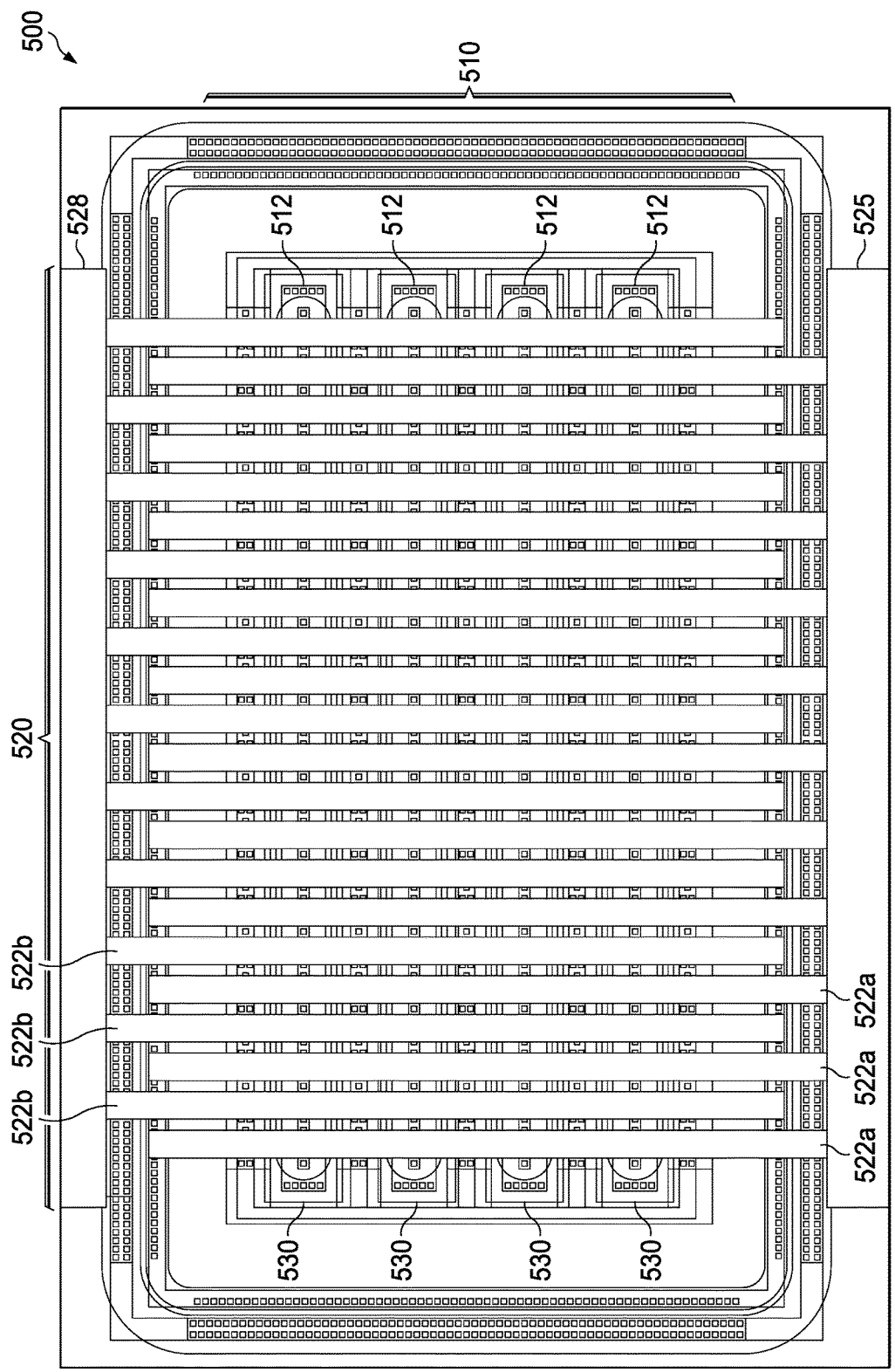
FIGS. 5A through 5D illustrate a graphical layout design of an example power transistor that includes drain segmentation according to this disclosure.
Figure 5B:
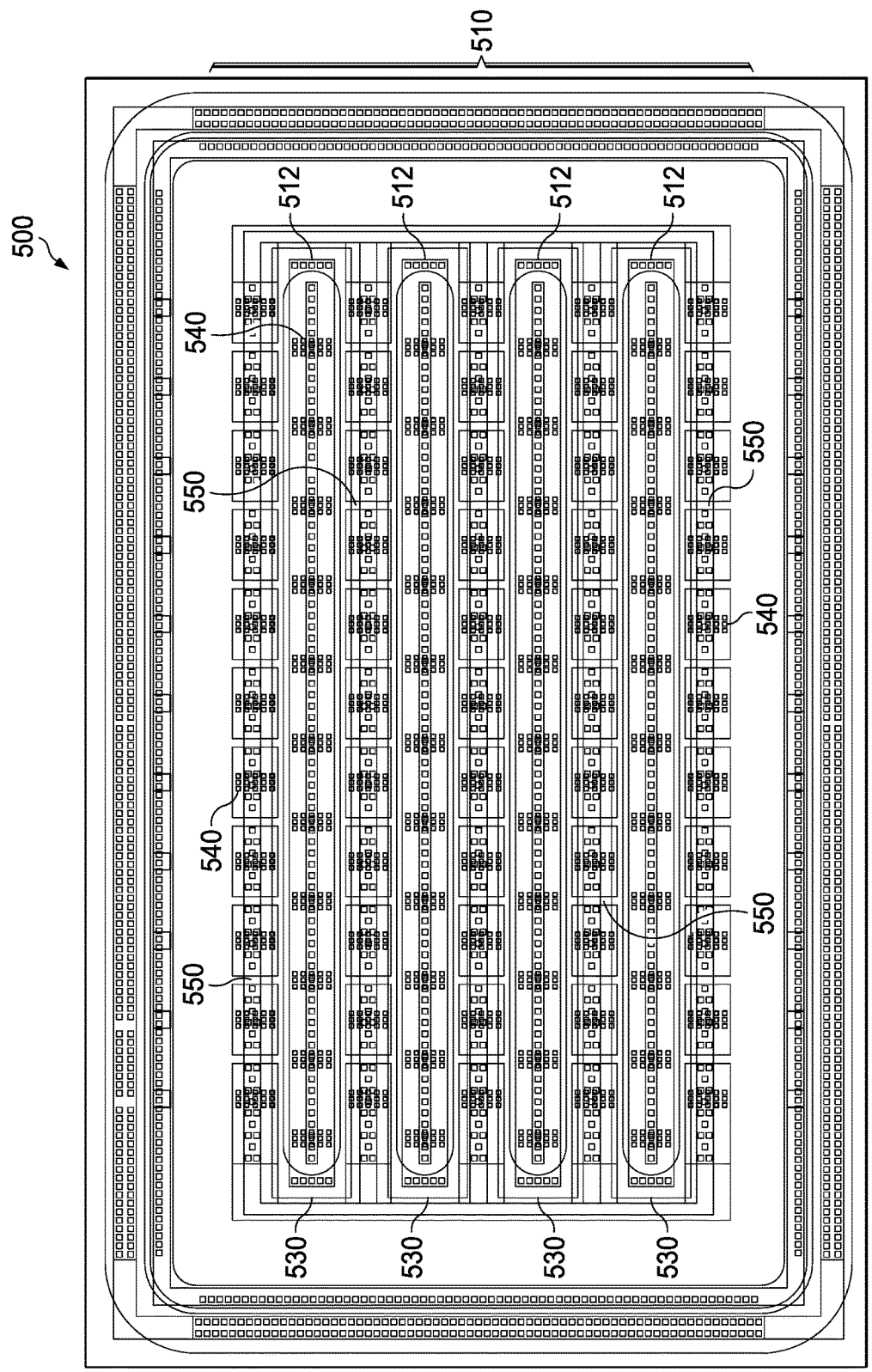
Figure 5C:
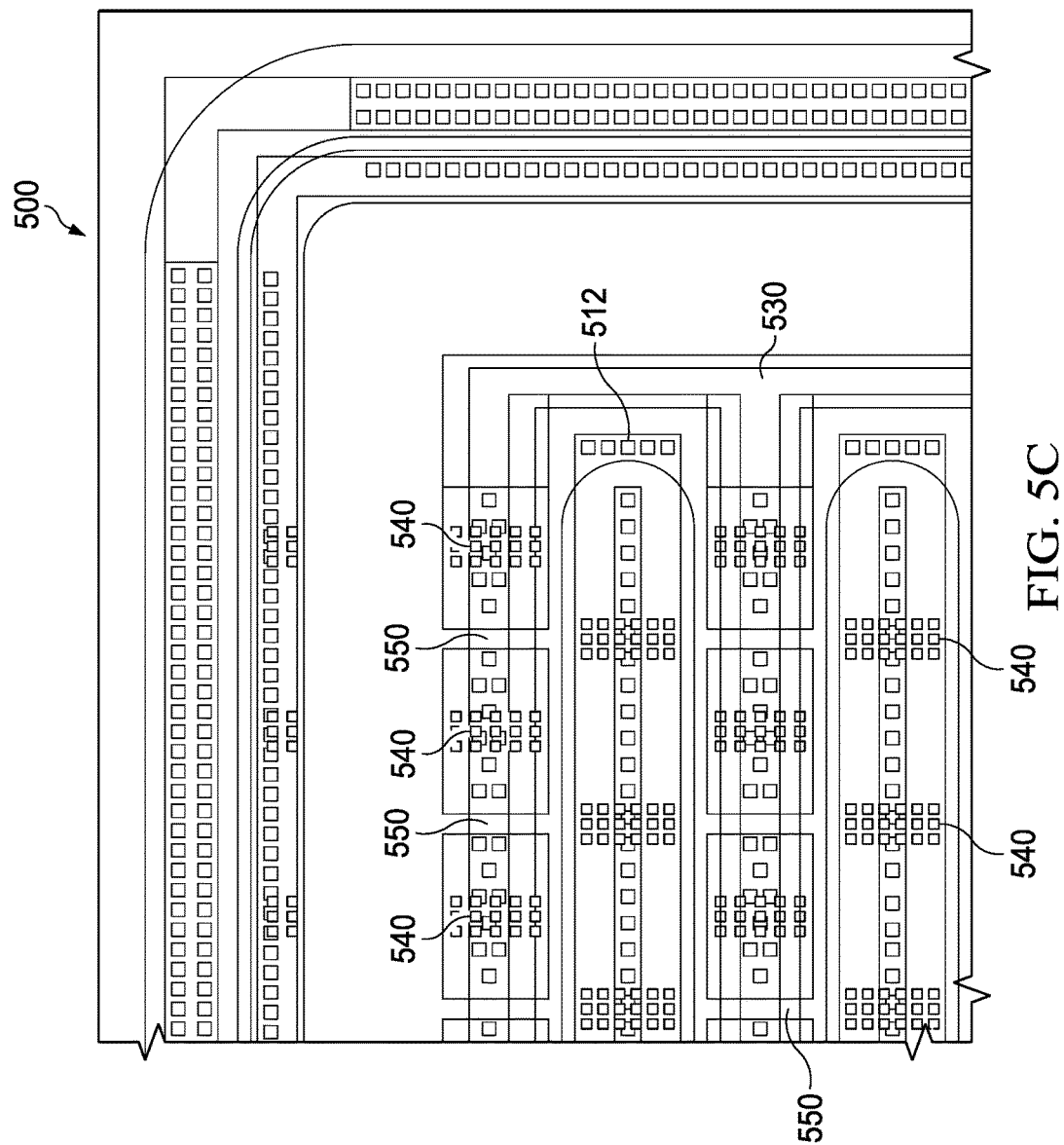
Figure 5D:
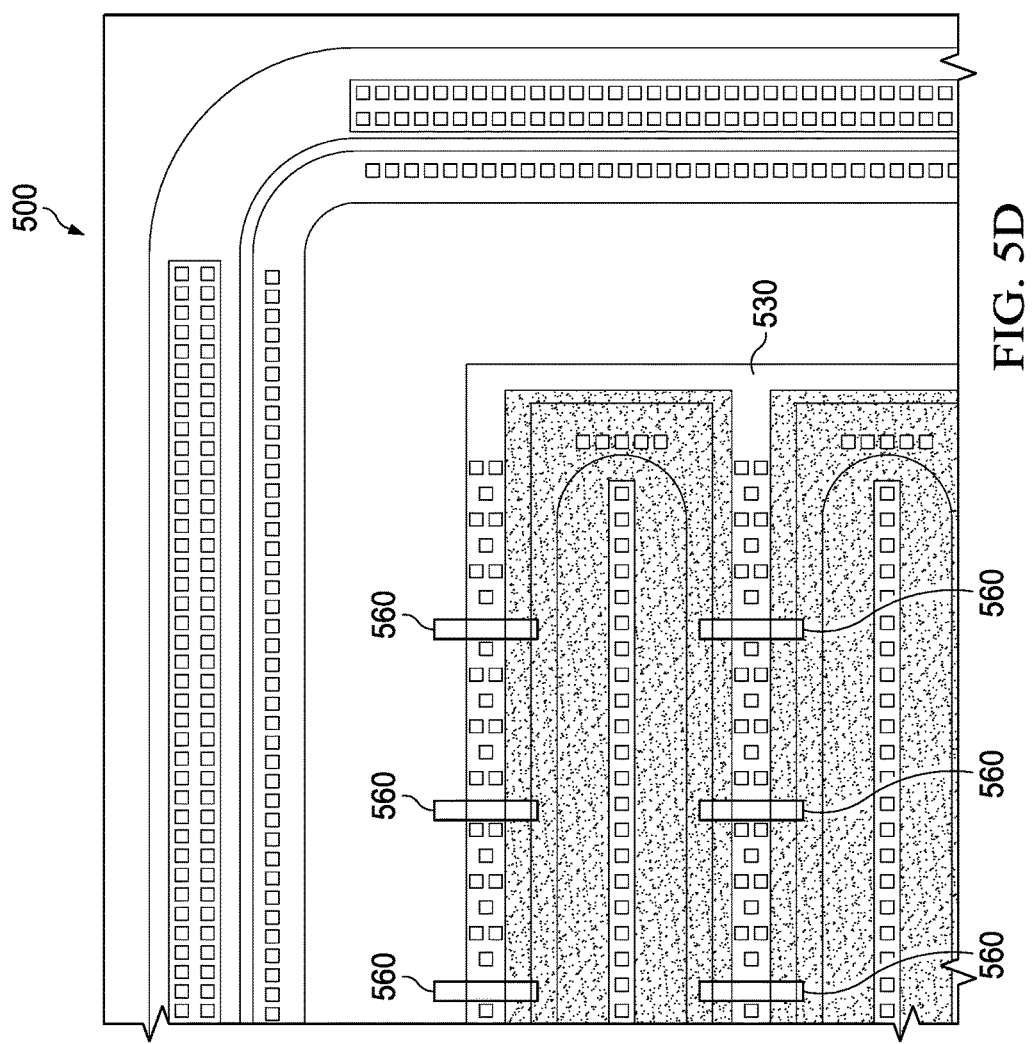
Figure 7A:
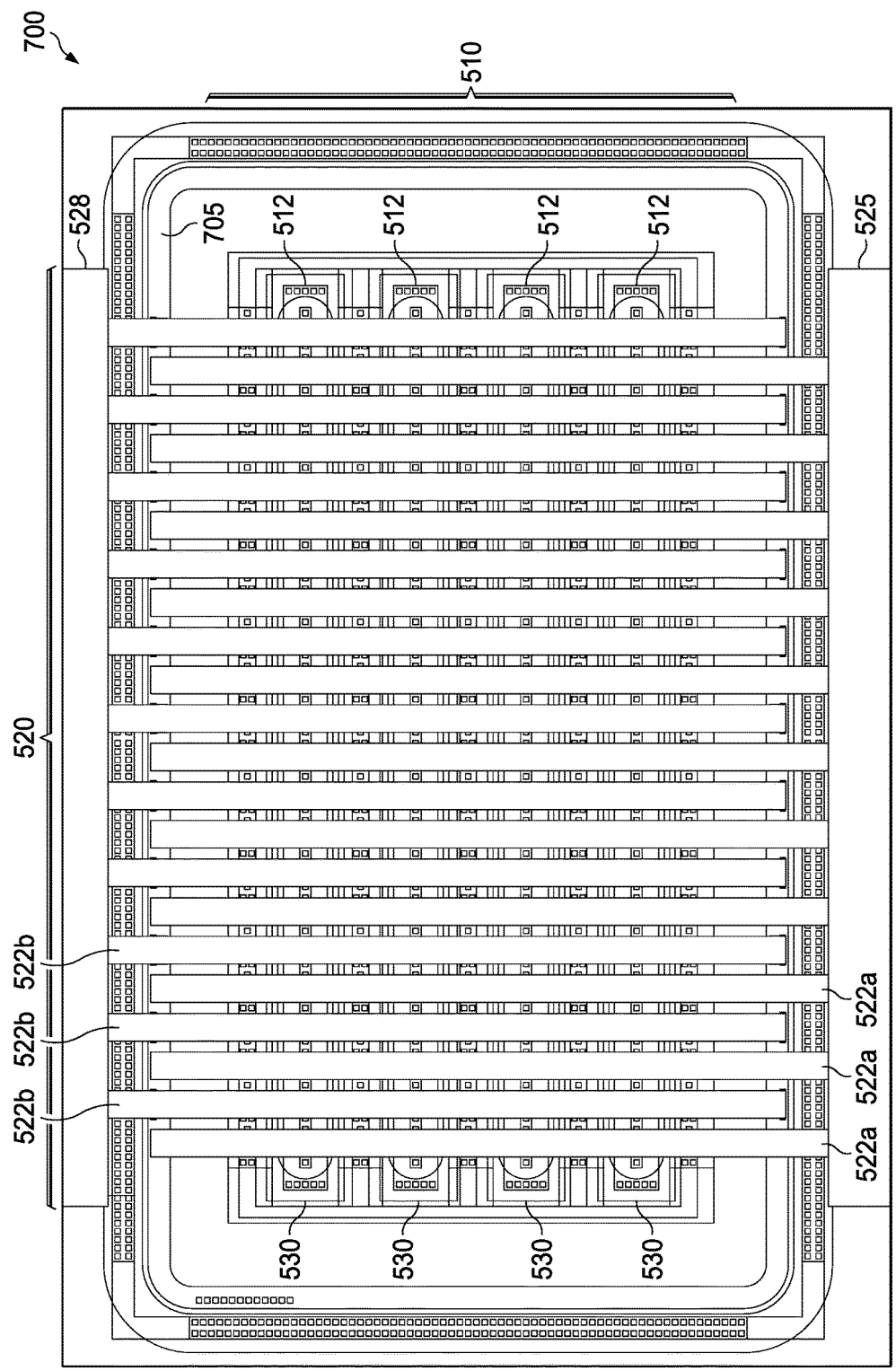
FIGS. 7A through 7D illustrate a graphical layout design of an example power transistor that includes drain and tank segmentation according to this disclosure
Figure 7B:
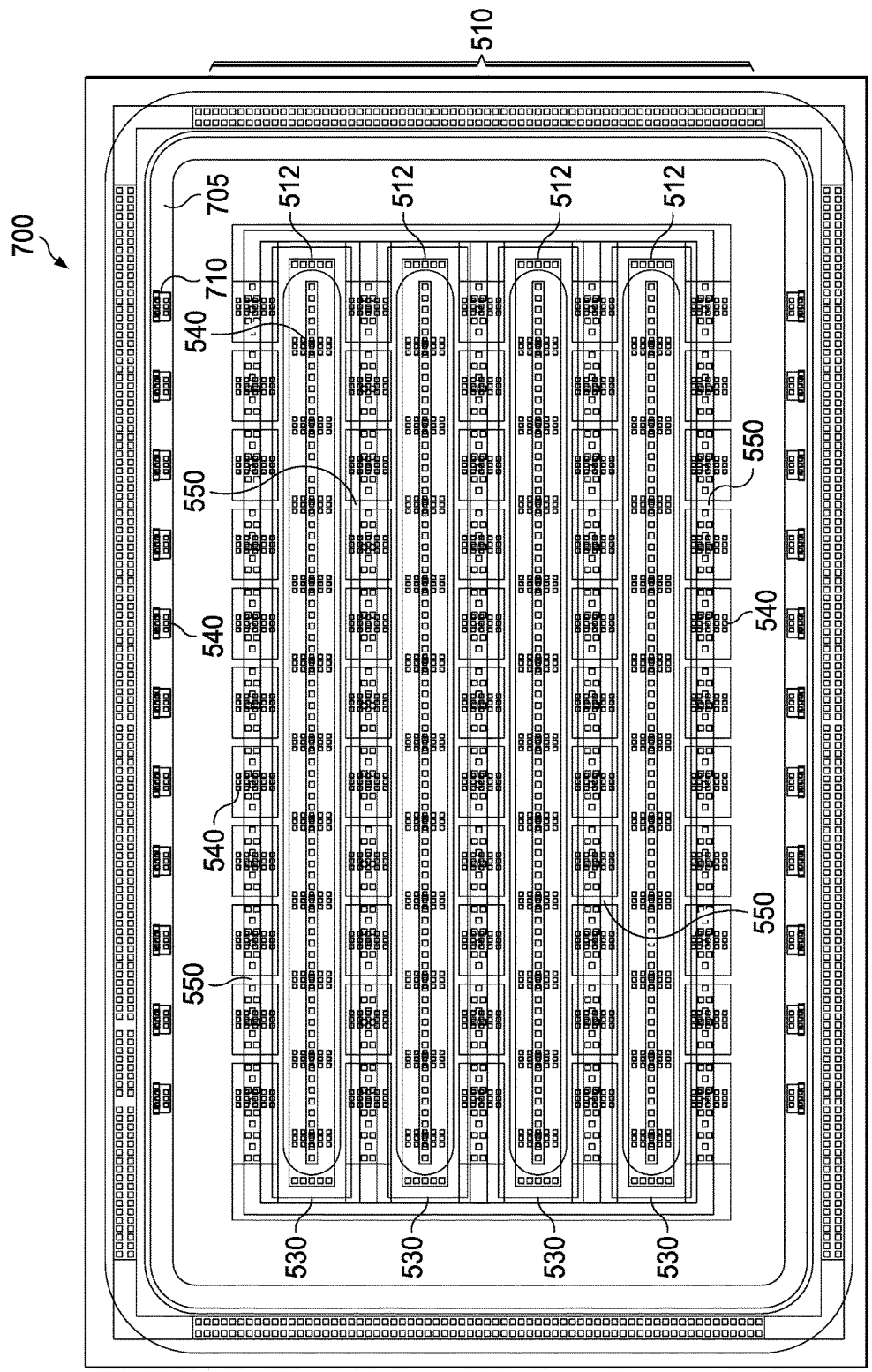
Figure 7C:
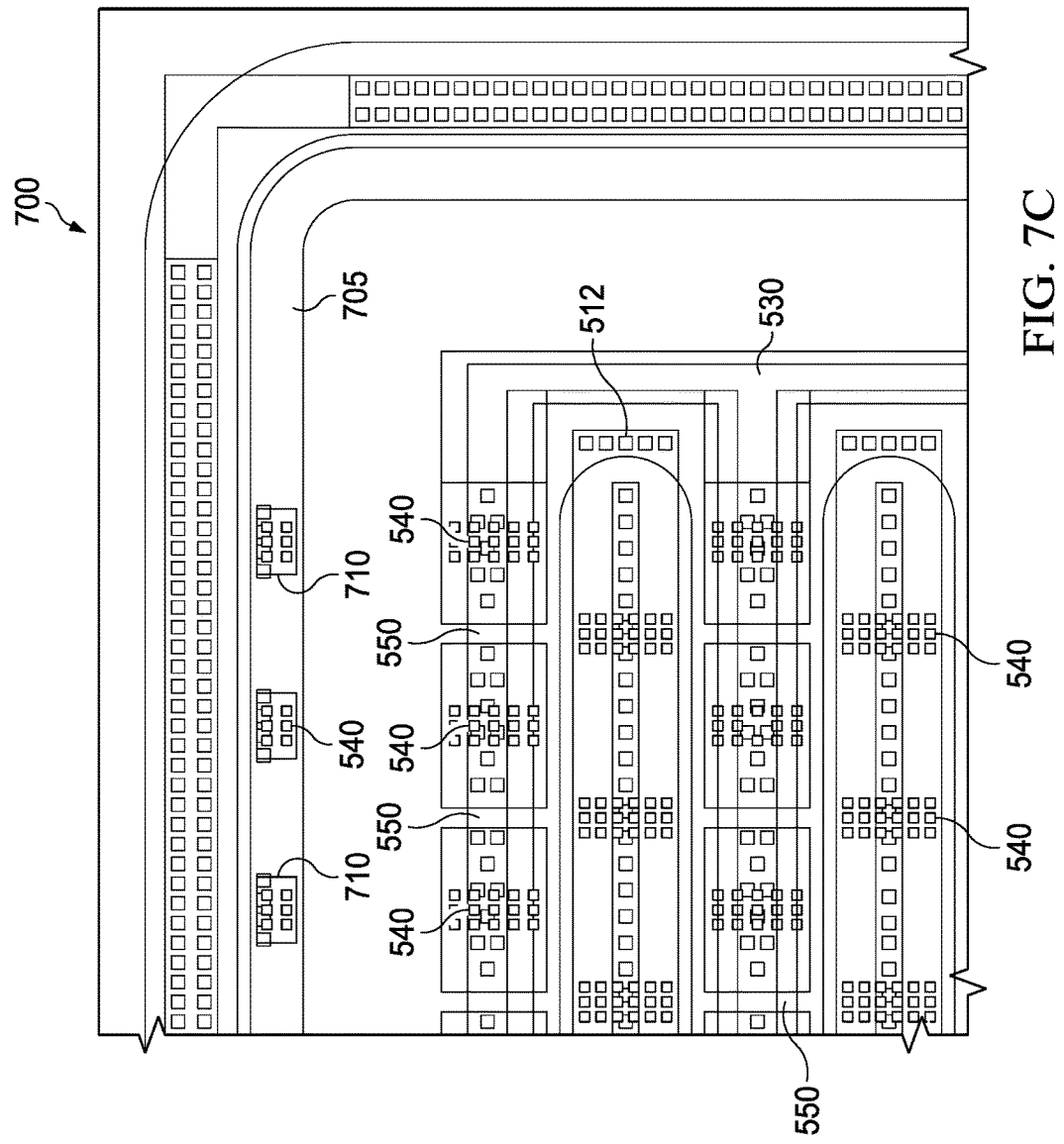
Figure 7D:
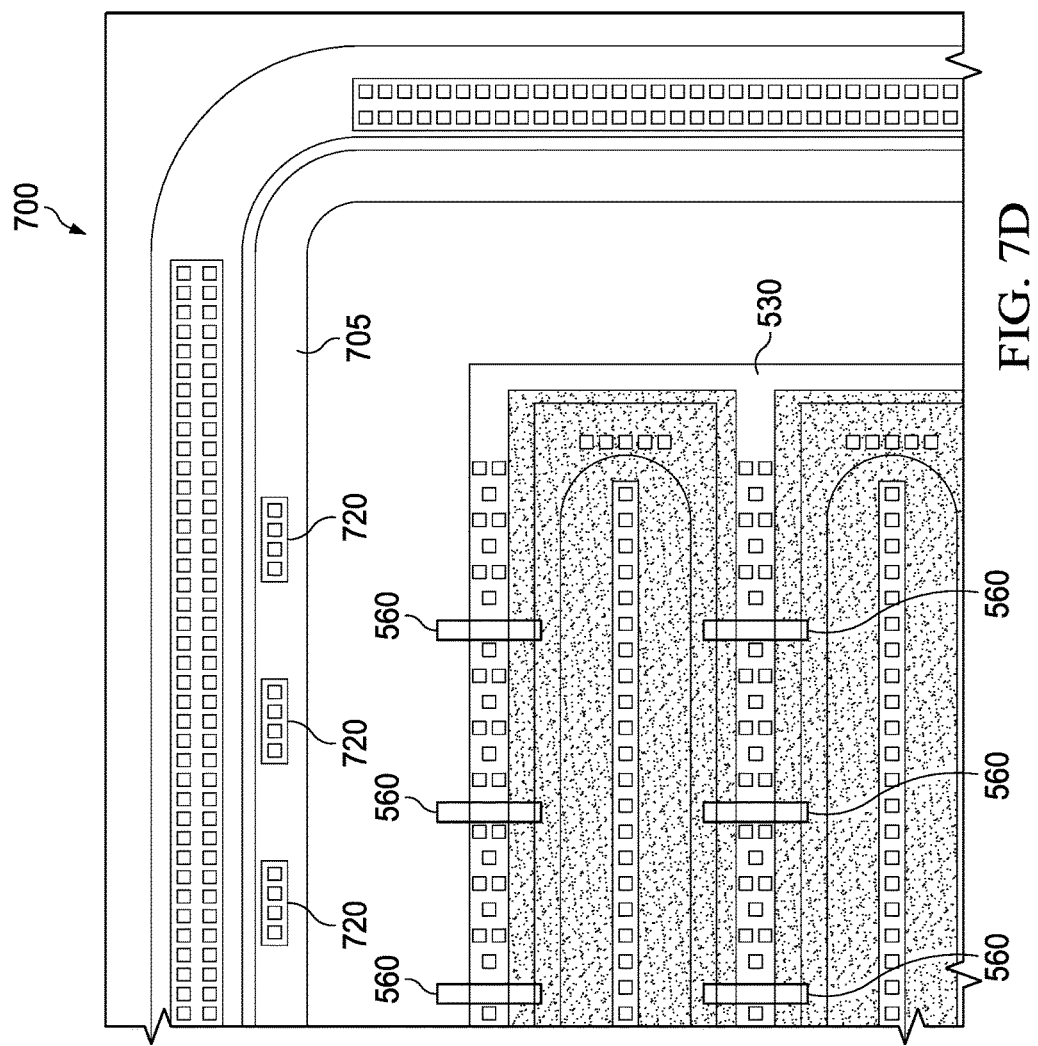

FIGS. 5A through 5D illustrate a graphical layout design of an example power transistor 500 that includes drain segmentation according to this disclosure. Many of the components of the power transistor 500 are the same as or similar to the components of the power transistor 200 in FIGS. 2A-2D or the power transistor 300 in FIGS. 3A-3D. For example, the power transistor 500 includes a conductive layer 510, a conductive layer 520, a silicide layer 530, multiple fingers 512, multiple connection lines 522a-522b, a common source connection 525, a common drain connection 528, and multiple vias 540. To the extent that these components are the same as or similar to corresponding components described above, a detailed description will be omitted. Similar to FIGS. 2B-2D, FIG. 5B illustrates the power transistor 500 with the conductive layer 520 removed, FIG. 5C illustrates a zoomed-in view of a portion of FIG. 5B, and FIG. 5D illustrates the zoomed-in view of FIG. 5C with the conductive layer 510 removed.

As shown in FIGS. 5B and 5C, the drain region of each finger 512 is segmented at a plurality of cut locations 550 along the length of the finger 512. The cut at each cut location 550 could be achieved, for example, by cutting the conductive layer 510 on the drain region of the finger 512 and removing any affected contact underneath. In some embodiments, a SIBLK 560 is also placed in the cut region to remove the silicide layer 530 under the cut location 550 as shown in FIG. 5D. The SIBLK 560 blocks the formation of silicide. As with the source segmentation, the segmentation cut at each cut location 550 does not fully disconnect neighboring segments but instead introduces a resistance between the neighboring drain segments by requiring current to pass through the silicide layer 530 and silicon moat (or pass through the silicon moat layer if the SIBLK 560 is in place). The resistance discourages the concentration of the full current of the power transistor 500 into a single portion of the power transistor 500, thus reducing the likelihood of filamentation.

As an example, if a given drain segment of a finger 512 breaks down before the other drain segments break down, the broken-down segment may try to pull the full device current into the segment. However, the resistance of the cuts in the adjacent cut locations 550 results in a voltage that acts as a "negative feedback," discouraging the concentration of the full device current into the broken-down drain segment. Similarly, the conductive drain connection line 522b connecting the broken-down drain segment to the common drain connection 520 also develops a voltage drop. This voltage drop reduces the drain-to-source voltage $V_{DS}$ for the broken-down segment and reduces the current for the broken-down segment, thus allowing other segments to begin to conduct. This results in an overall reduction in the likelihood of filamentation. Embodiments using drain segmentation may be particularly useful for current flow mechanisms, such as avalanche breakdown where the current flow is controlled more by $V_{DS}$ than $V_{GS}$.

Figure 6:
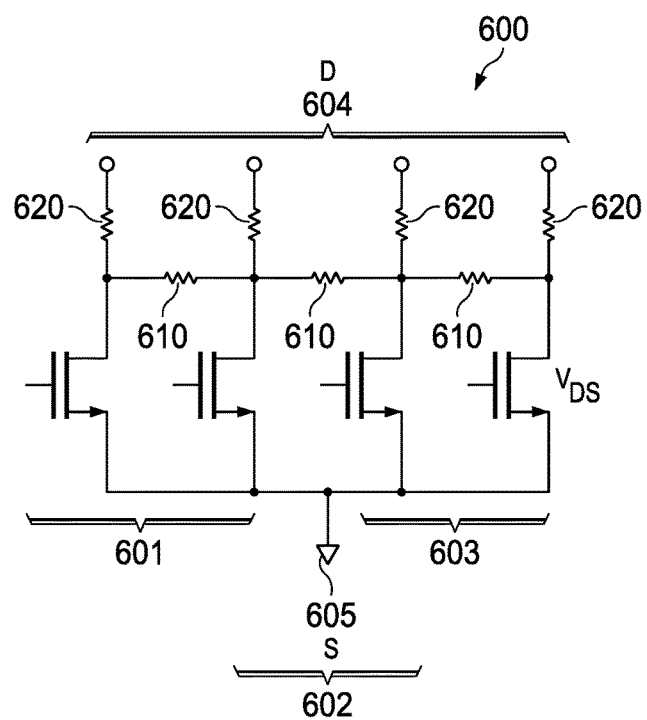
FIG. 6 illustrates a schematic circuit diagram of a portion of a power transistor that includes drain segmentation according to this disclosure.

FIG. 6 illustrates a schematic circuit diagram of a portion of a power transistor that includes drain segmentation according to this disclosure. As shown in FIG. 6, the power transistor 600 includes a plurality of sub-transistors 601-603 that share a common drain 604 and a common source 605. The power transistor 600 also includes a first set of resistors 610 and a second set of resistors 620. The first set of resistors 610 represent resistances between neighboring segments of the drain region of each finger. For example, the resistors 610 can represent the resistance of the moat layer as a result of the segmentation cuts at the cut locations 550 and the SIBLK 560 shown in FIGS. 5A-5D. The second set of resistors 620 represent resistances of the conductive drain connection lines 522b. If a drain segment attempts to push current into the common drain connection 520 (represented as common drain 604 in FIG. 6), the current would go through one of the long thin conductive connection lines 522b, which are represented as resistors 620. These resistors 620 may not have a very large resistance, but it is enough to generate a voltage that reduces the $V_{DS}$ voltage. That in turn acts as a negative feedback, thus reducing current and discouraging filamentation.

In some power transistors, such as high-side LDMOS transistors, the drain is connected to an isolation tank. The isolation tank is an n-type doped region of silicon built inside a p-type substrate and formed around one or more portions of the transistor. The tank can be formed to operate as part of the drain. In some embodiments, it is possible to segment the tank connection, which is tied to the drain but may provide an independent current flow path.

FIGS. 7A through 7D illustrate a graphical layout design of an example power transistor 700 that includes drain and tank segmentation according to this disclosure. Many of the components of the power transistor 700 are the same as or similar to the components of the power transistor 500 in FIGS. 5A-5D and use the same reference numerals.

As shown in FIGS. 7A-7D, the power transistor 700 also includes an isolation tank 705 that surrounds the fingers 512. The tank 705 is connected to the common drain connection 528 through a conductive layer 710 over the tank 705, the vias 540 over the conductive layer 710, and the conductive drain connection lines 522b over the vias 540. Without tank segmentation, the conductive layer 710 would substantially cover all portions of the tank 705. With tank segmentation, the conductive layer 710 is cut into segments, similar to the segmentation cuts at the cut locations 550 of the drain region of each finger 512. Under the conductive layer segments 710, the moat layer of the tank 705 is also segmented as indicated by reference number 720 in FIG. 7D. As with drain segmentation, the segmentation of the tank 705 introduces a resistance that discourages the concentration of the full current into portions of the tank 705, thus reducing the likelihood of filamentation. Because the tank 705 is connected to the common drain connection 528, a schematic representation of the power transistor 700 including both drain and tank segmentation would be the same as a schematic of the transistor 500 that only includes drain segmentation only. For example, the schematic 600 in FIG. 6 could represent either the transistor 500 in FIG. 5 or the transistor 700 in FIG. 7.

Note that various combinations of two or more of the previously-disclosed segmentation embodiments can be used together. For example, a power transistor could include any combination of source segmentation, drain segmentation, and tank segmentation. As a particular example, the power transistor 700 can have tank segmentation without drain segmentation. In such an embodiment, the power transistor 700 would not include the drain segmentation cuts at the cut locations 550 or the SIBLK 560. As another example, a power transistor can include segmentation in the source, drain, and tank regions. In some implementations, such a power transistor is particularly suited to avoiding filamentation.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transistor, comprising:
   a first contiguous doped region and a second contiguous doped region, the first and second contiguous doped regions spaced apart from each other and each extending continuously along a first direction between respective first and second ends;
   first and second linear arrays of lower conductive segments, each linear array having a first segmented portion and a second segmented portion separated from the first segmented portion, the first and second segmented portions of the first linear array being conductively coupled to the first contiguous doped region and spaced apart between the first and second ends of the first contiguous doped region, and the first and second segmented portions of the second linear array being conductively coupled to the second contiguous doped region and spaced apart between the first and second ends of the second contiguous doped region; and
   first and second upper conductive lines extending along a second direction different from the first direction and above the first and second linear arrays, the first upper conductive line connected to the first segmented portions of the first and second linear arrays, and the second upper conductive line connected to the second segmented portions of the first and second linear arrays.

2. The transistor of claim 1, wherein the first and second segmented portions of each of the first and second linear arrays are separated by a respective cut location having a higher electrical resistance than each of the first and second segmented portions.

3. The transistor of claim 1, wherein the first and second segmented portions of each of the first and second linear arrays are separated by a respective silicide block.

4. The transistor of claim 1, wherein the first and second contiguous doped regions include first and second drain regions.

5. The transistor of claim 1, wherein the first and second contiguous doped regions include first and second source regions.

6. The transistor of claim 1, wherein:
   the first and second linear arrays are patterned from a first metal layer;
   the first and second upper conductive lines are patterned from a second metal layer above the first metal layer; and the second metal layer has a lower resistivity than the first metal layer.

7. The transistor of claim 1, further comprising:
a third contiguous doped region and a fourth contiguous doped region, the third and fourth contiguous doped regions spaced apart from each other and each extending continuously along the first direction between respective first and second ends, the third and fourth contiguous doped regions interleaving with the first and second contiguous doped regions along the second direction;
third and fourth linear arrays of lower conductive segments interleaving with the first and second linear arrays along the second direction, the third and fourth linear arrays of lower conductive segments conductively coupled to the third and fourth contiguous doped regions, respectively; and
third and fourth upper conductive lines interleaving with the first and second upper conductive lines along the first direction and above the third and fourth linear arrays, the third upper conductive line connected to the first segmented portions of the third and fourth linear arrays, and the fourth upper conductive line connected to the second segmented portions of the third and fourth linear array.

8. The transistor of claim 1, wherein each of the first and second linear arrays includes a longitudinal end with a rounded endcap.

9. The transistor of claim 1, wherein each of the first and second linear arrays includes a longitudinal end with a silicide block region.

10. The transistor of claim 1, further comprising:
an isolation tank line laterally surrounding the first and second linear arrays, the isolation tank line includes a first segmented tank portion and a second segmented tank portion separated from the first segmented tank portion.

11. An integrated circuit, comprising:
power transistors, each including:
first and second doped regions spaced apart from each other and each extending continuously along a first direction between a first end and a second end;
first and second lower linear arrays of conductive line segments, each lower linear array having a first segmented portion and a second segmented portion separated from the first segmented portion, the first and second segmented portions of the first lower linear array having collinear longest axes, and the first and second segmented portions of the second lower linear array having collinear longest axes, the first and second segmented portions of the first lower linear array being conductively coupled to the first doped region and spaced apart between first and second ends of the first doped region, and the first and second segmented portions of the second lower linear array being conductively coupled to the second doped region and spaced apart between first and second ends of the second doped region; and
first and second upper conductive lines extending along a second direction different from the first direction and above the first and second lower linear arrays, the first upper conductive line connected to the first segmented portions of the first and second lower linear arrays, and the second upper conductive line connected to the second segmented portions of the first and second lower linear arrays.

12. The integrated circuit of claim 11, wherein the first and second segmented portions of each of the first and second lower linear arrays are separated by a cut location having a higher electrical resistance than each of the first and second segmented portions.

13. The integrated circuit of claim 11, wherein the first and second segmented portions of each of the first and second lower linear arrays are separated by a silicide block.

14. The integrated circuit of claim 11, wherein the first and second doped regions include first and second drain regions.

15. The integrated circuit of claim 11, wherein:
the first and second lower linear arrays are patterned from a first metal layer;
the first and second upper conductive lines are patterned from a second metal layer above the first metal layer; and
the second metal layer has a lower resistivity than the first metal layer.

16. The integrated circuit of claim 11, wherein each of the power transistors includes:
third and fourth doped regions interleaving with the first and second doped regions along the second direction and being conductively isolated from the first and second doped regions;
third and fourth linear arrays of lower conductive segments interleaving with the first and second lower linear arrays along the second direction, the third and fourth linear arrays of lower conductive segments electrically coupled to the third and fourth doped regions, respectively; and
third and fourth upper conductive lines interleaving with the first and second upper conductive lines along the first direction and above the third and fourth linear arrays of lower conductive segments, the third upper conductive line electrically connected to respective first segmented portions of the third and fourth lower linear arrays, and the fourth upper conductive line electrically connected to respective second segmented portions of the third and fourth lower linear arrays.

17. The integrated circuit of claim 11, wherein each of the first and second lower linear arrays includes a respective longitudinal end with a rounded endcap.

18. The integrated circuit of claim 11, wherein each of the first and second lower linear arrays includes a respective longitudinal end with a silicide block region.

19. The integrated circuit of claim 11, wherein each of the power transistors includes:
an isolation tank line laterally surrounding the first and second lower linear arrays, the isolation tank line including a first segmented tank portion and a second segmented tank portion separated from the first segmented tank portion.

20. A transistor, comprising:
first and second doped regions spaced apart from each other and each extending continuously along a first direction between a first end and a second end;
first and second lower linear arrays of conductive line segments, each lower linear array having a first segmented portion and a second segmented portion separated from the first segmented portion, the first and second segmented portions of the first lower linear array having collinear longest axes, and the first and second segmented portions of the second lower linear array having collinear longest axes, the first and second segmented portions of the first lower linear array being electrically coupled to the first doped region and spaced apart between the first and second ends of the first doped region, and the first and second segmented portions of the second lower linear array being electrically coupled to the second doped region and spaced apart between the first and second ends of the second doped region; and first and second upper conductive lines extending along a second direction different from the first direction and above the first and second lower linear arrays, the first upper conductive line connected to the first segmented portions of the first and second lower linear arrays, and the second upper conductive line connected to the second segmented portions of the first and second lower linear arrays.

21. The transistor of claim 1, wherein the first and second linear arrays of lower conductive segments comprise a silicide.

22. The transistor of claim 7, wherein the first and second upper conductive lines are connected to a common source connection, and the third and fourth upper conductive lines are connected to a common drain connection.

* * * * *